US012010805B2

(12) United States Patent
Mayberry et al.

(10) Patent No.: US 12,010,805 B2
(45) Date of Patent: Jun. 11, 2024

(54) STACKABLE BATTERY ASSEMBLIES AND METHODS OF USE

(71) Applicant: Ford Global Technologies, LLC, Dearborn, MI (US)

(72) Inventors: Scott Mayberry, Allen Park, MI (US); Raj Sohmshetty, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 987 days.

(21) Appl. No.: 16/921,639

(22) Filed: Jul. 6, 2020

(65) Prior Publication Data
US 2022/0007526 A1 Jan. 6, 2022

(51) Int. Cl.
*H05K 5/02* (2006.01)
*B60L 53/80* (2019.01)
*H01M 10/42* (2006.01)
*H01M 50/576* (2021.01)

(52) U.S. Cl.
CPC ............ *H05K 5/0221* (2013.01); *B60L 53/80* (2019.02); *H01M 10/425* (2013.01); *H01M 10/4257* (2013.01); *H01M 50/576* (2021.01); *Y02T 10/70* (2013.01)

(58) Field of Classification Search
CPC ...... H05K 5/0221; H05K 5/023; B60L 53/80; H01M 10/425; H01M 10/4257; Y02T 10/70; Y02T 10/7072
See application file for complete search history.

(56) References Cited

U.S. PATENT DOCUMENTS

| | | | | |
|---|---|---|---|---|
| 6,027,828 A | * | 2/2000 | Hahn | H04M 1/0262 429/96 |
| 10,189,525 B2 | * | 1/2019 | Allen | B62J 9/21 |
| 10,532,667 B2 | * | 1/2020 | Chen | B60L 53/305 |
| 11,077,767 B2 | * | 8/2021 | Reimer | B60L 50/20 |
| 2011/0227527 A1 | * | 9/2011 | Zhu | H02J 50/90 320/108 |
| 2016/0207418 A1 | | 7/2016 | Bergstrom et al. | |

(Continued)

FOREIGN PATENT DOCUMENTS

| DE | 102018006690 A1 | 2/2019 |
|---|---|---|
| EP | 2492182 A2 | 8/2012 |

OTHER PUBLICATIONS

Praveen M, "Revolt RV400 Electric Bike: First Ride Review", published Aug. 28, 2019.

*Primary Examiner* — Richard Isla
*Assistant Examiner* — Sadia Kousar
(74) *Attorney, Agent, or Firm* — Emily Drake; Eversheds Sutherland (US) LLP

(57) ABSTRACT

Stackable battery assemblies and methods of use are disclosed herein. An example battery assembly includes an energy storage device, a housing having a locking unit, a receiver unit, and a sidewall that are interconnected to form an enclosure that retains the energy storage device. The locking unit can include a plate that is spaced apart from the sidewall of the housing by a second sidewall, the plate supporting a first electrical connector that is electrically coupled to the energy storage device via a locking member. The receiver unit can include a third sidewall that defines a cavity that is shaped to correspond with the locking unit, the third sidewall having a lock notch and a second electrical connector that is electrically coupled to the energy storage device.

14 Claims, 8 Drawing Sheets

(56) References Cited

U.S. PATENT DOCUMENTS

2016/0280086 A1* 9/2016 Lopez ..................... B60L 53/16
2018/0301913 A1* 10/2018 Irish ....................... H02J 7/007
2021/0384746 A1* 12/2021 Zeiler .................. H01M 50/244

* cited by examiner

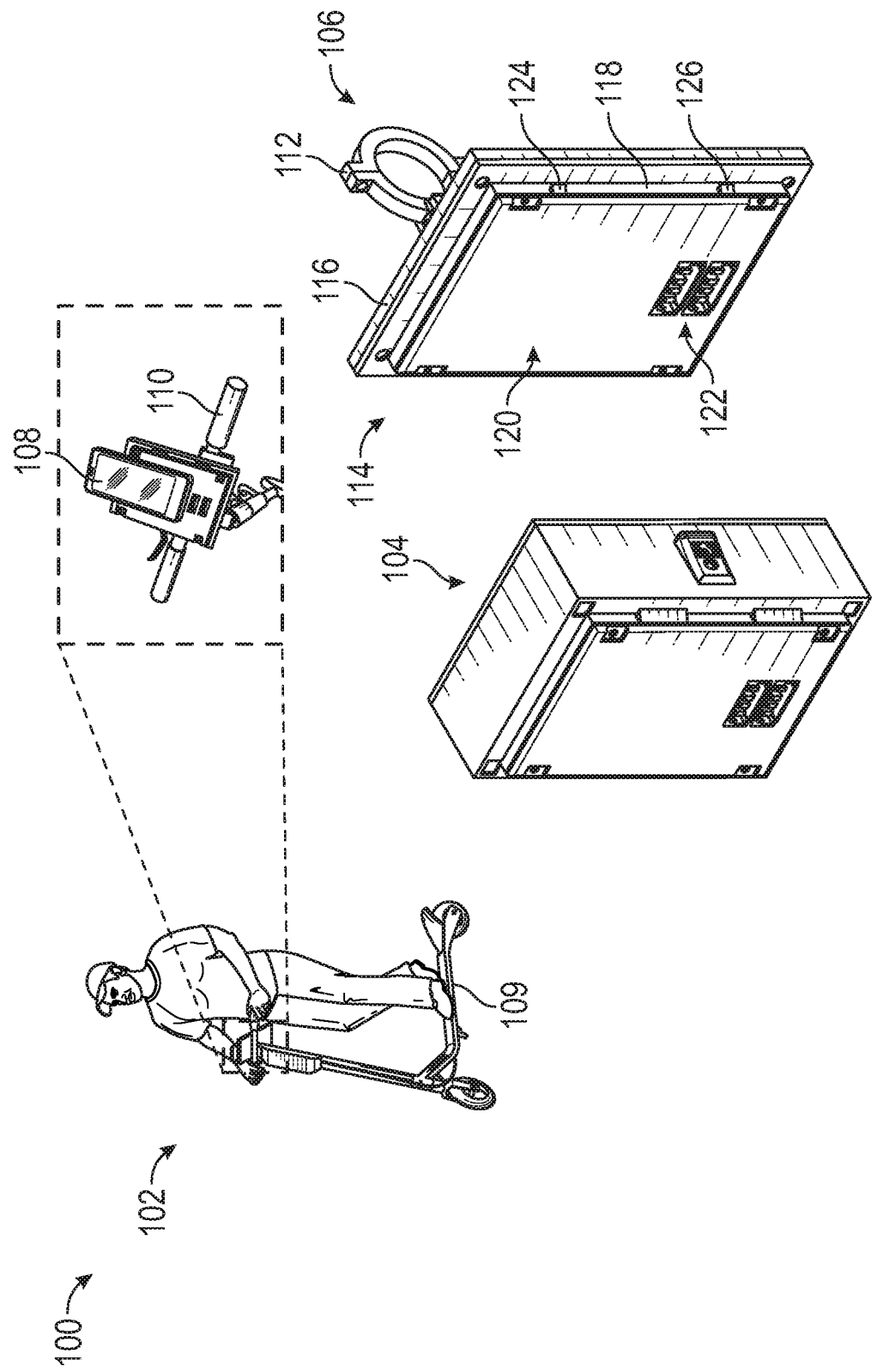

STACKABLE BATTERY ASSEMBLIES AND METHODS OF USE

BACKGROUND

Battery swapping will likely become a major industry in the drone, mobility, and mobile platform world. Battery chemistry and safety requirements limit charging speeds. For drones and mobile platforms such as electronic scooters, this limitation requires workers to manually swap batteries, or spend hours charging these devices.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

FIG. 1 depicts an illustrative architecture in which techniques and structures for providing the systems and methods disclosed herein may be implemented.

DETAILED DESCRIPTION

Overview

Figure 2A:
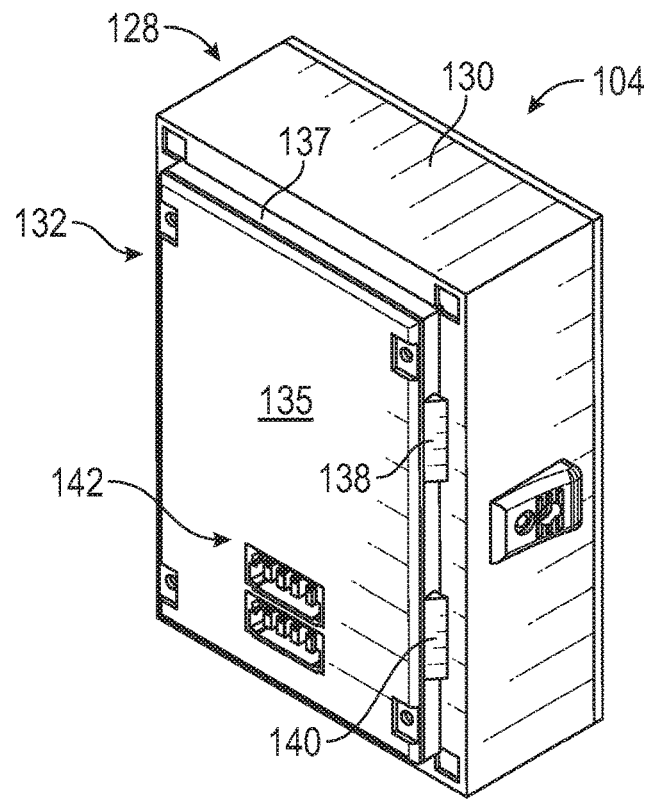
FIGS. 2A-2C depict various views of a stackable battery assembly.

The present disclosure is generally directed to stackable battery assemblies and methods of use. The stackable battery apparatuses can be used to power, for example, an electric scooter or other personal transportation devices. While powering personal transportation devices is contemplated herein, the stackable battery apparatuses disclosed herein can be used to transmit and/or receive power to any desired electrical device. The swappable batteries disclosed herein can be used in Bring-Your-Own-Battery (BYOB) Model paradigms. In these uses cases, users bring their swappable batteries to both power and charge a personal transportation device. Battery assemblies of the present disclosure can stack on top of each other to provide extra power to both the onboard battery (referred to generally as a main or primary battery) and the load (electric motor in this case).

Communication between battery assemblies can be enabled using either wireless communication or hard-wired communication. In some configurations, stackable battery assemblies can include a locking system/mechanism that utilizes angled members (e.g., locking members) that are spring-loaded and can be retracted through use of an associated actuator.

With respect to personal transportation devices, such as eScooters, total energy content, recharge time, and accessibility to recharging locations can be key limiters to deployment and customer satisfaction for the ever-growing number of electrified vehicle applications today. In the case of eScooters, as one example application, vehicles are typically either utilized by private users from a commercial operator on a cost per minute basis or by private users who own their personal scooters. For commercial operators of fleets of scooters, the collection and transport of scooters frequently for recharging and redeployment is a major cost driver and challenge in their overall business equation.

For private users of personal scooters, commuting distances to and from work and/or other frequently visited destinations may not allow for scooter use due to the limited range of the scooter and/or the inability to recharge at work or other frequent destinations. There is a need to reduce the frequency of collection, transport, and re-charge and associated costs for commercial fleet operators or to increase the effective daily range of privately owned scooters.

Illustrative Embodiments

Turning now to the drawings, FIG. 1 depicts an illustrative architecture 100 in which techniques and structures of the present disclosure may be implemented. The architecture 100 can comprise a personal transportation device 102, such as an electronic scooter, a stackable battery assembly 104, a mounting member 106, and a mobile device 108 that can be associated with the stackable battery assembly 104, as will be discussed in greater detail infra.

The personal transportation device 102 can include a main battery 109 that powers wheels of the personal transportation device 102 through a control mechanism such as handlebars 110. The mounting member 106 can couple with the handlebars 110 via a bracket 112. The mounting member 106 can comprise a locking unit 114 and can include a base plate 116 that supports the bracket 112. A mounting member sidewall 118 may extend from the base plate 116 in a direction that is opposite of the bracket 112. A front plate 120 can be positioned on the mounting member sidewall 118. The front plate 120 can include an electrical connector 122 that is configured to couple with another electrical connector of the stackable battery assembly 104, as will be discussed below. The mounting member 106 can also comprise locking members 124 and 126 that are configured to releasably secure the stackable battery assembly 104 to the mounting member 106. It will be understood that the locking members 124 and 126 function similarly to locking members of the stackable battery assembly 104.

Figure 2B:
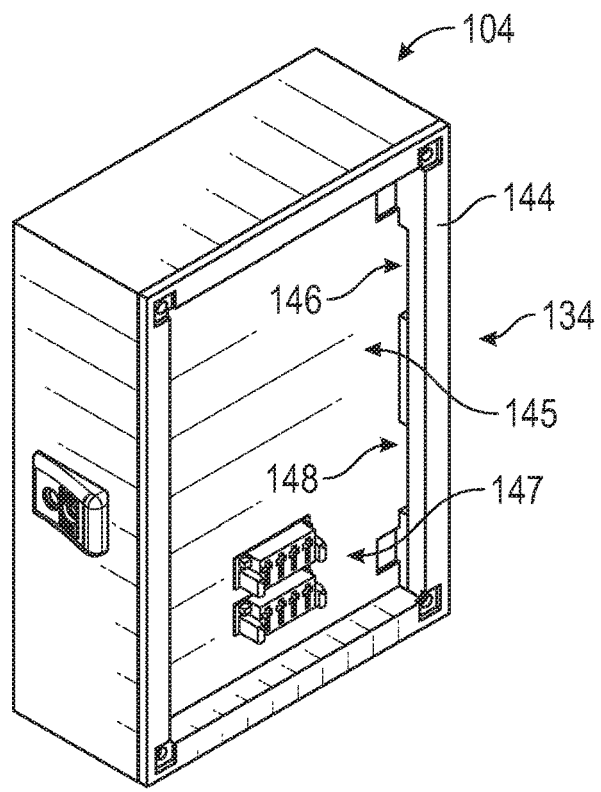
Figure 2C:
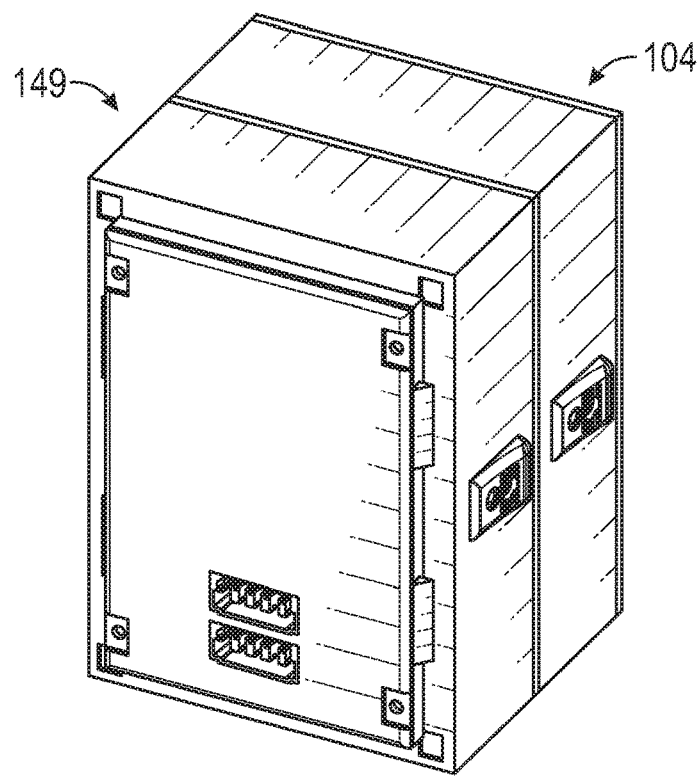

FIGS. 2A-2C each illustrate views of the stackable battery assembly 104. The stackable battery assembly 104 can include a housing 128 that includes a sidewall 130, a locking unit 132, and a receiver unit 134. The sidewall 130 spaces apart the locking unit 132 and the receiver unit 134 to create an enclosure that receives an energy storage device (illustrated in the schematic diagram of FIG. 7). The locking unit 132 includes a plate 135 that is mounted on a second sidewall 137. A manual actuator 136 is located on the sidewall 130 that can be used to actuate movement of locking member 138 and locking member 140. The locking unit 132 can have additional or fewer locking members than those illustrated. The plate 135 can include a female electrical connector 142 that interfaces with a complementary electrical interface on the receiver unit 134.

The receiver unit 134 includes a third sidewall 144 that defines a cavity 145. The third sidewall 144 is sized to match the second sidewall 137 of the locking unit 132. That is, the locking unit 132 can be inserted into the cavity 145 of the receiver unit 134, which is defined by the third sidewall 144. The third sidewall 144 includes lock notches, such as lock notch 146 and 148 that receive the locking member 138 and locking member 140, respectively. The receiver unit 134 can include a male electrical connector 147 that can interface with the female electrical connector 142 of the locking unit 132, or the electrical connector 122 of the mounting member 106 (see FIG. 1). As with the female electrical connector 142, the male electrical connector 147 can be coupled to the energy storage device of the stackable battery assembly 104 (again, illustrated in the schematic diagram of FIG. 7). FIG. 2C illustrates the stackable battery assembly 104 in combination with another stackable battery assembly 149 that is constructed identically to the stackable battery assembly 104.

Figure 3:
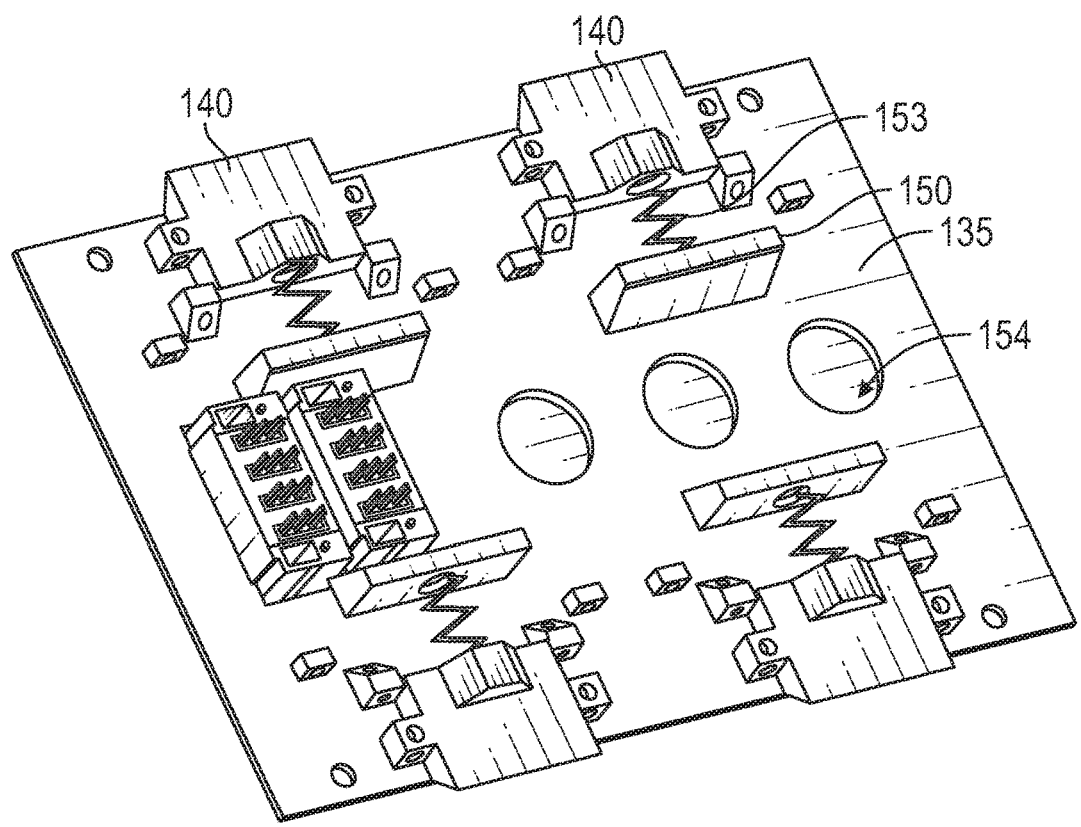
FIG. 3 depicts a perspective view of a portion of a stackable battery assembly that includes locking members.
Figure 5:
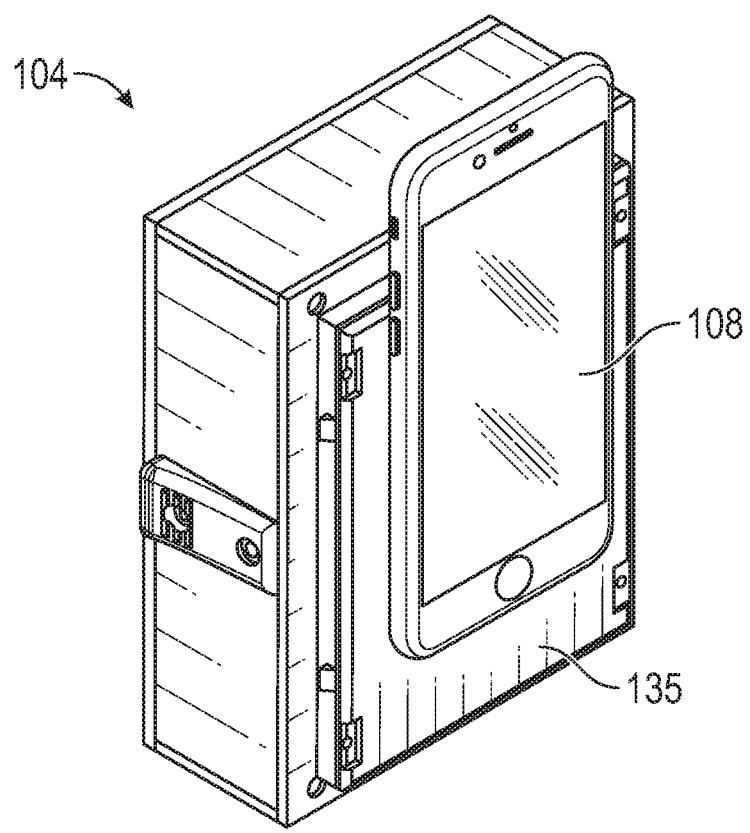
FIG. 5 depicts a mobile device in combination with a stackable battery assembly.

FIG. 3 illustrates an inner view of the plate 135 having a plurality of assemblies that include the locking member 138 and the locking member 140. In this view, additional locking members can also be seen. Each of the locking members can be associated with a backstop. For example, the locking member 138 can be associated with a backstop 150. A resilient member 153, such as a spring, can be placed between the locking member 138 and the backstop 150. The resilient member 153 biases the locking member 138 into an extended, locking position. The plate 135 can also include a magnetic portion 154 that is configured to exert a magnetic force to hold an object in place against the plate 135 (such as the mobile device of FIG. 1). An example of this magnetic association is illustrated in FIG. 5 where the mobile device 108 is magnetically coupled with the plate 135.

Figure 4:
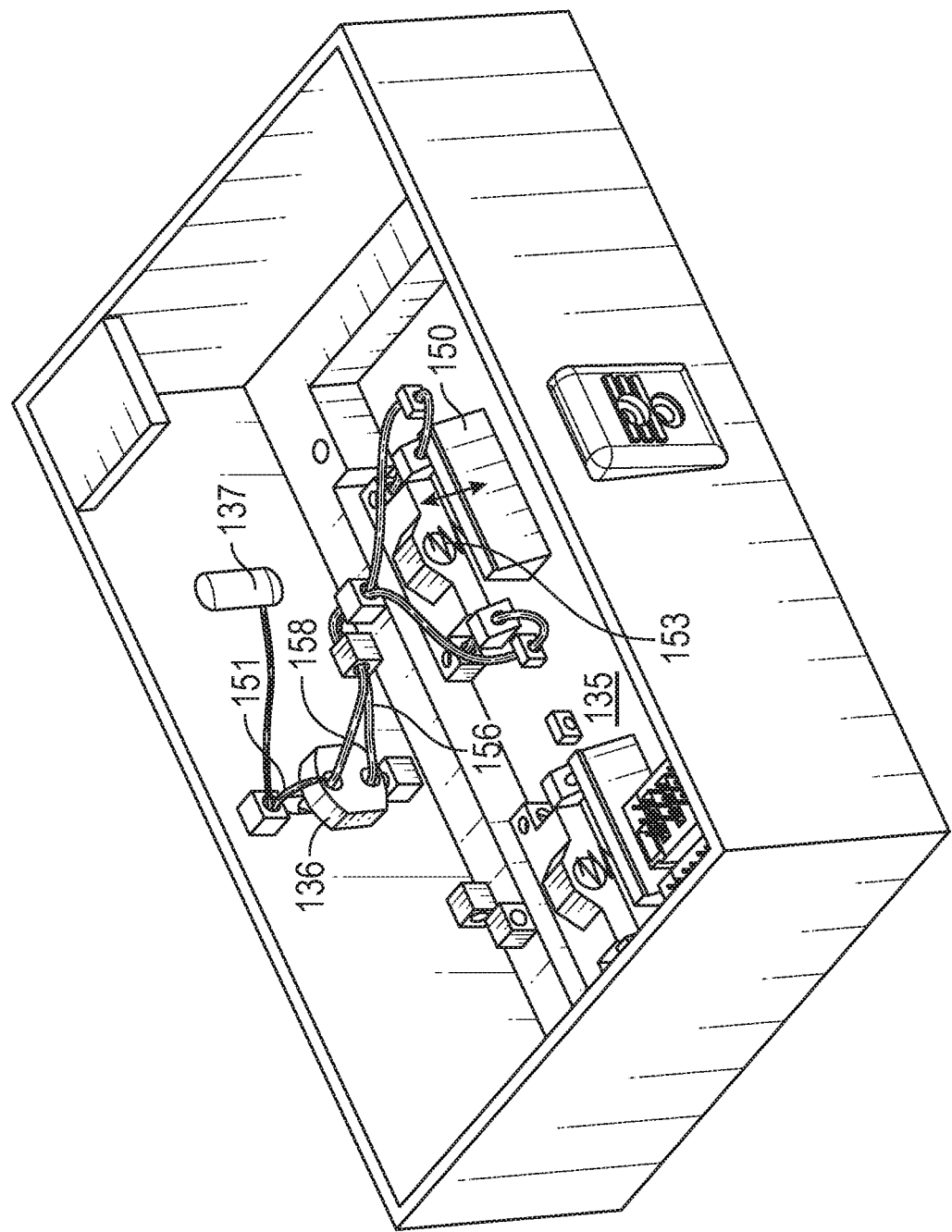
FIG. 4 depicts a perspective view of a portion of a stackable battery assembly that includes locking members in association with an actuator.

In FIG. 4, the locking member 138 can be coupled with the manual actuator 136 through cables such as cable 156 and cable 158. The cable 156 can be coupled to a first side of the locking member 138 through a series of guides. The cable 158 can be coupled to a second side of the locking member 138 through another series of guides. The manual actuator 136 can move the actuator between a resting or locked position where the locking member 138 is in its extended, locking position, to an unlocked position where the locking member 138 is in its retracted, unlocked position. When the manual actuator 136 is moved to the unlocked position (travels upwardly along the slot 151), the cables 156 and 158 are pulled, which causes the cables 156 and 158 to pull against the locking member 138 drawing the locking member 138 towards the backstop 150. It will be understood that while a cable and actuator arrangement has been disclosed, the locking member 138 can be actuated using any other desired mechanism, such as a servo or motor.

The pulling of the locking member 138 towards the backstop 150 compresses the resilient member 153. When the user releases the manual actuator 136, the resilient member 153 extends, moving the locking member 138 back to its extended, locking position. When the locking member 138 is in the extended, locking position it can be positioned in a lock notch of a receiver unit of another stackable battery assembly 104. When the locking member 138 is in the retracted, unlocked position, the locking member 138 is withdrawn from the lock notch so that the stackable battery assemblies can be disassociated from one another. Another identical actuator and locking member arrangement can be located on an opposing side of the housing.

In addition to the manual actuator 136, an electronically actuated controlled actuator 137 can be included in the stackable battery assembly. The cables 156 and 158 can be associated with the electronically actuated controlled actuator 137 in such a way that activation of the electronically actuated controlled actuator 137 causes movement of the cables 156 and 158 in a manner described above, which results in movement of the locking member 138. The electronically actuated controlled actuator 137 could include a servo, a motor, or any other suitable mechanism. The electronically actuated controlled actuator 137 can actuate movement of the locking member 138 through pulling or winding of the cables 156 and 158. In general, operation of the electronically actuated controlled actuator 137 can be controlled using a controller included in the stackable battery assembly. An example controller is illustrated and described with reference to FIG. 7. In some configurations, the electronically actuated controlled actuator can be actuated based on a request from a mobile device, a request from another stackable battery assembly, or from a mounting member/docking station—just to name a few.

Figure 6:
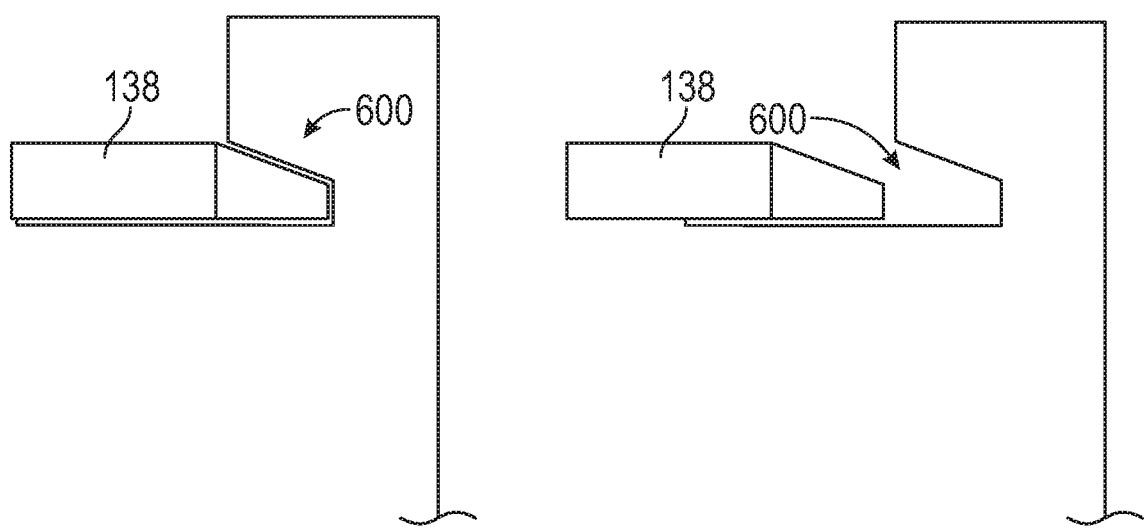
FIG. 6 depicts partial cross-sectional views of a locking member in an extended, locking position within a lock notch of another stackable battery assembly. The locking member is also illustrated in a retracted, unlocked position relative to the lock notch of another stackable battery assembly.

FIG. 6 is a partial cross-sectional view of the locking member 138 in the extended, locking position within a lock notch 600 of another stackable battery assembly. The locking member 138 is also illustrated in the retracted, unlocked position relative to the lock notch 600 of another stackable battery assembly.

Figure 7:
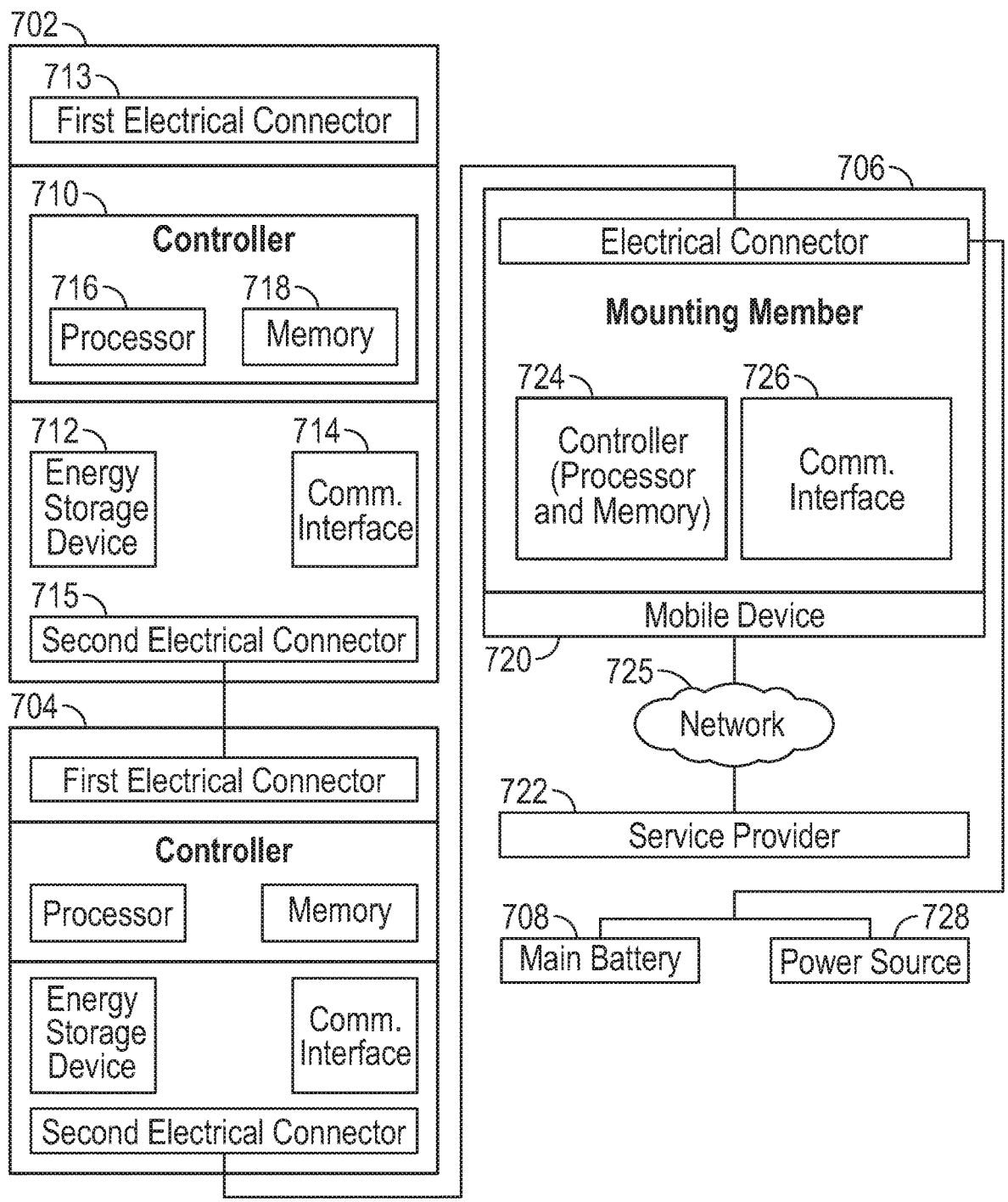
FIG. 7 depicts a schematic diagram of a stack of stackable battery assemblies that can be controlled to provide power to a personal transportation device.

In FIG. 7 an arrangement of a plurality of stackable battery assemblies are illustrated in combination with a main battery of a personal transportation device. The stack 700 includes two stackable battery assemblies 702 and 704. These stackable battery assemblies are identical and correspond to the stackable battery assembly 104 of FIG. 1. A first stackable battery assembly 702 is electrically and mechanically coupled with a second stackable battery assembly 704. The second stackable battery assembly 704 is electrically coupled to a mounting member 706 (see mounting member 106 of FIG. 1). As noted above, the mounting member 706 can couple to a personal transportation device. The mounting member 706 can be electrically coupled to a main battery 708 of the personal transportation device.

In more detail, the first stackable battery assembly 702 can comprise a controller 710, an energy storage device 712, a communications interface 714, a first electrical connector 713, and a second electrical connector 715. The controller 710 can include a processor 716 and memory 718. The processor 716 executes logic stored in the memory 718 such as battery management logic. In general, each stackable battery assembly can communicate with other stackable battery assemblies through the use of the controller and the communications interface. The communications interface could include a wired or wireless interface. When a wired connection is used, the electrical connector(s) of the stackable battery assemblies can be used. In configurations where a wireless interface is used, the wireless interface can use any short-range or long-range wireless protocol. Examples of short-range protocols include Bluetooth, near-field communications, Infrared, and the like. Long-range wireless protocols can include the use of a network such as cellular, Wi-Fi, and the like.

The first stackable battery assembly 702 can be electrically coupled with the second stackable battery assembly 704 when the second electrical connector 715 of the first stackable battery assembly 702 is connected to a first electrical connector of the second stackable battery assembly 704. A second electrical connector of the second stackable battery assembly 704 can electrically couple with an electrical connector of the mounting member 706. The electrical connector of the mounting member 706 can be coupled to the main battery 708 of the personal transportation device. As noted above, while charging and/or power of a personal transportation device is disclosed, it will be understood that the stackable battery assemblies disclosed herein (including use of a mounting member) can be used to charge and/or power other electrical devices such as laptops, personal computers, and so forth. The first electrical connector 713 of the first stackable battery assembly 702 can receive another stackable battery assembly.

The mounting member 706 can also be adapted for use as a charging station for charging one or more stackable battery assemblies. For example, the electrical connector of the mounting member 706 can couple with a power source 728 such as an 110V AC power source. The mounting member 706 can comprise a dedicated electrical interface for coupling with the power source 728 as well. The power source 728 could include an AC or DC power source. The mounting member 706 can include components to convert AC to DC and/or DC to AC as needed. The power source 728 can provide electrical energy to charge the main battery 708, or any of the energy storage devices of the stackable battery assemblies. The charging order of the stackable battery assemblies can be controlled by the controller 724 of the mounting member 706.

The controller 710 can be programmed to perform various battery management features. For example, the controller 710 can be configured to determine a state of charge of the energy storage device 712, monitor current output of the energy storage device 712, manage communication with other stackable battery assemblies, coordinate energy usage across multiple stackable battery assemblies, and implement controlled power output states.

As noted above, the stackable battery assemblies can magnetically associate with a mobile device 720. In addition, the controller 710 can be configured to utilize GPS signals from the mobile device, along with other information such as weather data, and camera information. In some instances, the controller 710 can also leverage the communicative capabilities of the mobile device. The controller 710 could cause the mobile device 720 to transmit battery (energy storage device) information or metrics to a service provider 722 through the mobile device 720. The service provider 722 could be associated with a company that provides the personal transportation device (e.g., eScooter). Rather than communicating through the mobile device 720, each of the controllers of the stackable battery assemblies can be configured to transmit their battery data directly to the service provider 722 through a network 725, which can include any public and/or private communications medium.

The mobile device 720 can also transmit travel data for various purposes, such as predicting a final location for the personal transportation device. The mobile device 720 can provide facial recognition for user/ride verification, as well as helmet image recognition, which could enable a ride restriction such as speed throttling (when no helmet is used by a rider). In some instances, the mounting member 706 can also include a controller 724 and communications interface 726.

Figure 8:
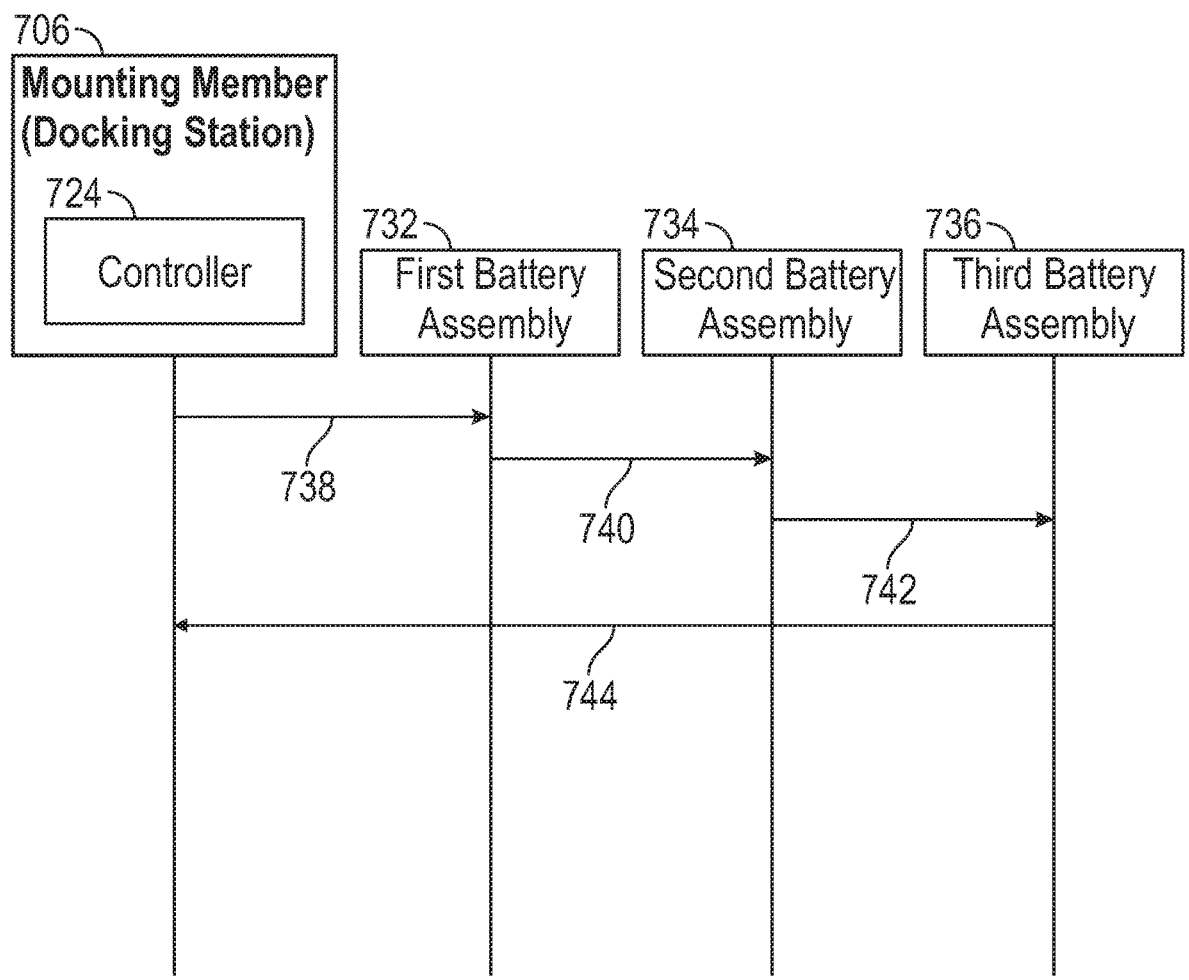
FIG. 8 is a signal flow diagram through an example plurality of stackable batteries and mounting member/docking station.

Referring briefly to FIG. 8, in some instances, the mounting member 706 may be referred to as a docking station. The controller 724 can be configured to communicate with any of a plurality of stackable battery assemblies.

When a plurality of stacked batteries are electrically and communicatively coupled together using physical connections between electrical connectors of adjacent stacked battery assemblies, the controller 724 can facilitate data exchange through a daisy-chain communication scheme (using serial peripheral interface communication as an example). When the controller 724 requests a state of charge (SoC) for each battery in a stack of three battery assemblies, the controller 724 can transmit this SoC report request to the battery assembly that is electrically and communicatively coupled to the mounting member 706. For purposes of explanation, this battery assembly is referred to as the first battery assembly 732. A second battery assembly 734 is stacked onto the first battery assembly 732, and a third battery assembly 736 can be stacked onto the second battery assembly 734. The request for SoC report can be transmitted from the mounting member 706 to the first battery assembly 732 as a signal 738. In some instances, the first battery assembly 732 can transmit its SoC data to the second battery assembly 734 as signal 740, along with the request SoC data in a packet or other suitable format. The second battery assembly 734 forwards both its SoC data and the SoC data of the first battery assembly 732 to the third battery assembly 736 as signal 742, along with the request SoC data as a packet. A direct communicative connection 744 can be created from the third battery assembly 736 to the mounting member 706 through the electrical connectors that couple the stacked battery assemblies. A response packet can be transmitted from the third battery assembly 736 to the controller 724 of the mounting unit 706 through the direct communicative connection 744. In other configurations, each of the battery assemblies could individually respond with a data packet back to the controller 724 of the mounting unit 706. In another example, the SoC request could be passed up the chain to a distal-most battery assembly (last or highest battery assembly in the stack furthest away from the docking station/mounting member). In a reverse collection process, the response packets can be forwarded down the stack of battery assemblies down to the mounting member 706.

Figure 9:
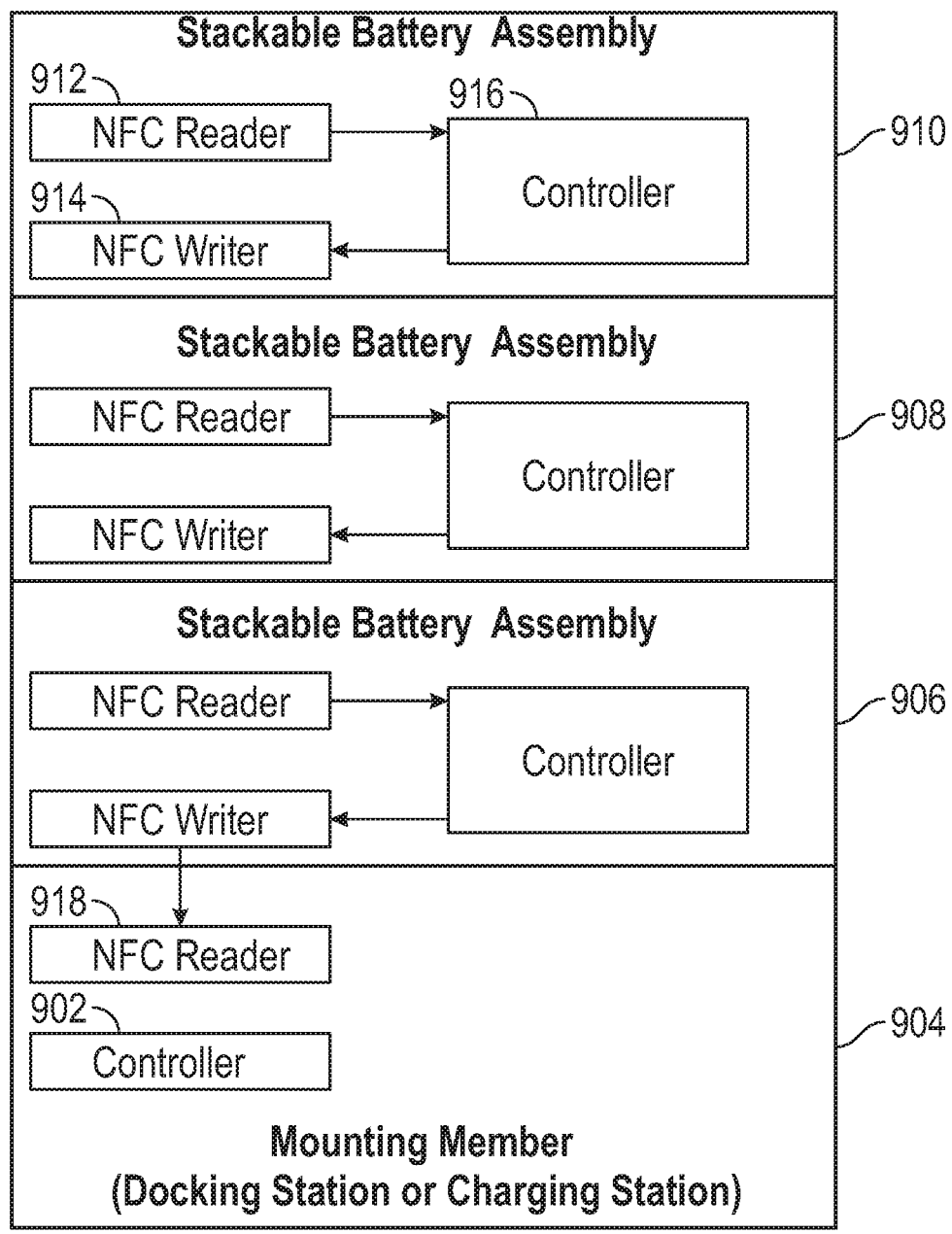
FIG. 9 schematically illustrates daisy-chain data flow through a plurality of stackable battery assemblies into a mounting member through near-field communication.

Referring now to FIG. 9, which illustrates another example configuration where stackable battery assemblies can communicate in a daisy-chain manner using NFC. Some configurations allow a controller 902 of a mounting member 904 (the mounting member 904 is configured similarly to the mounting member 706 of FIG. 7) to communicate with communication using near-field communications (NFC) or other suitable short-range wireless communications protocols.

In some instances, each of a plurality of stackable battery assemblies, such as stackable battery assemblies 906, 908, and 910, are configured similarly to one another. Each of these stackable battery assemblies can be constructed similarly to battery assemblies disclosed above, with the exception that the communication interface(s) used for each of the batteries can include both a NFC reader and a NFC writer. For example, the stackable battery assembly 906 can have a NFC reader 912 and a NFC writer 914 which communicate with a controller 916. To be sure, the functionalities of the NFC reader 912 and the NFC writer 914 could be combined into a single device/component. The mounting member 904 can include an NFC reader 918.

Based on a request from the mounting member 904 (or based on scheduled communications), the stackable battery assembly 910 could obtain a request for data, such as operational battery metrics. For example, a short-range wireless request signal can be transmitted from the controller 918 of the mounting member 904 to the controller 916 of the stackable battery assembly 910. This request could come from the controller 902 of the mounting member 904, as an example. The controller 916 can obtain the desired data and transmit the acquired data to the stackable battery assembly 908 using the NFC writer 914. Using its own NFC reader/NFC writer, the stackable battery assembly 908 can obtain its data and forward its data, along with the data from the stackable battery assembly 910 to the stackable battery assembly 906. The stackable battery assembly 906 transmits data for all of the stackable battery assemblies to the NFC reader 918 of the mounting member 904. This chain of collecting and forwarding data down through a stack of battery assemblies (e.g., top-down) through use of NFC reading and writing can be used for a stack of battery assemblies of any number.

In general, at least one (or potentially each) of the stackable battery assemblies in the daisy-chain can be configured to receive a request from the docking station, the request being fulfilled by transmission of data through the plurality of stackable battery assemblies to the docking station.

In general, the use of controllers within the swappable battery assemblies and the mounting member can enable fine-tune control of the amount of power available to the main battery and/or operations of the eScooter. Controller-based battery management (e.g., energy usage schema) may enable finer control of power swapping and unique power controls. In one use case, if two stacked batteries are being used to power a load of a personal transportation device, instead of the multiple batteries acting in parallel, a single battery can be used at a time. This allows for complete draining of a top battery assembly before using the energy of the next battery assembly. What this allows for is the independent swapping of the drained battery assembly while keeping a full battery assembly powering the personal transportation device. This means the bottom swappable battery can be treated as an emergency backup power source with control systems being utilized to swap the batteries stacked on top.

Other example (such as for drones), if a drone picks up multiple stacked battery assemblies, there are two battery use options. In a first optional use case, the controller(s) can cause all batteries to discharge together (in parallel). In a second optional use case, the controller(s) can cause one battery to discharge at a time. The second use case can be enabled by a swapping strategy. The drone can utilize the stacked battery assemblies in order, draining the bottom ones first. If the drone needs to perform an emergency landing, or cannot get back to a safe location on the current charge, the drone can dump the dead battery assemblies to decrease the weight of the system while keeping the same amount of power onboard.

The swappable/stackable battery assemblies provide the ability to easily add additional and user-selectable battery capacity and range to a given electric vehicle platform in a form that allows for easy personal transport of the additional battery capacity device(s) together with a recharging station in the form of an easy to access interface integrated into a very widely deployed and pre-existing mass-market consumer electronics device infrastructure. The solution includes the following aspects: A battery pack system and recharging/docking station and/or vehicle interface that can be connected and restrained and/or disconnected both mechanically and electrically with a single physical operator action. A recharging interface can be integrated into a docking station which is also utilized to convert high voltage AC (Alternating Current) power into lower voltage DC (Direct Current) power and which can be utilized to power another electronics device (such as a laptop PC), as well serve as a communication and/or power hub for other electronic devices (PC desktop monitor, keyboard, mouse, phone, and other USB-powered or otherwise-powered device). A docking station of the present disclosure can include either automatic or manual control of power distribution to/from connected devices and which may also include predictive and/or adaptive algorithms and controls in the case of automatic power distribution. Stackable/swappable battery systems and recharging station(s) and/or vehicle interface(s) of the present disclosure can accommodate multiple additional individual battery pack systems in a stackable configuration.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," and the like indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

Implementations of the systems, apparatuses, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general-purpose or special-purpose computer system. Computer-readable media that stores computer-executable instructions are computer storage media (devices). Computer-readable media that carry computer-executable instructions is transmission media. Thus, by way of example, and not limitation, implementations of the present disclosure can comprise at least two distinctly different kinds of computer-readable media: computer storage media (devices) and transmission media.

Computer storage media (devices) includes RAM, ROM, EEPROM, CD-ROM, solid state drives (SSDs) (e.g., based on RAM), flash memory, phase-change memory (PCM), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or any combination of hardwired or wireless) to a computer, the computer properly views the connection as a transmission medium. Transmission media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the present disclosure may be practiced in network computing environments with many types of computer system configurations, including in-dash vehicle computers, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by any combination of hardwired and wireless data links) through a network, both perform tasks. In a distributed system environment, program modules may be located in both the local and remote memory storage devices.

Further, where appropriate, the functions described herein can be performed in one or more of hardware, software, firmware, digital components, or analog components. For example, one or more application specific integrated circuits (ASICs) can be programmed to carry out one or more of the systems and procedures described herein. Certain terms are used throughout the description and claims refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors and may include hardware logic/electrical circuitry controlled by the computer code. These example devices are provided herein for purposes of illustration and are not intended to be limiting. Embodiments of the present disclosure may be implemented in further types of devices, as would be known to persons skilled in the relevant art(s).

At least some embodiments of the present disclosure have been directed to computer program products comprising such logic (e.g., in the form of software) stored on any computer-usable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described exemplary embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

What is claimed is:

1. A battery assembly, comprising:
an energy storage device;
a housing comprising a locking unit disposed on a first side of the housing, a receiver unit disposed on a second side of the housing opposite the first side, and a sidewall interconnecting the locking unit and the receiver unit to form an enclosure that retains the energy storage device therein, the housing further comprising:
a first electrical connector that is disposed on the first side and electrically coupled to the energy storage device, the first electrical connector facing in a first direction;
a locking member that is disposed on the first side and resiliently biased into an extended, locking position, the locking member configured to be placed into a retracted, unlocked position by operation of either a manual actuator that is mechanically coupled to the locking member or an electronically controlled actuator that is mechanically coupled to the locking member; and a second electrical connector that is disposed on the second side and electrically coupled to the energy storage device, the second electrical connector facing in a direction opposite the first direction in order that the second electrical connector can mate with a separate third electrical connector of a third device while at the same time the first electrical connector mates with a separate fourth electrical connector of a fourth device; and a mounting member that comprises a bracket configured to couple with a personal transportation device, and a locking member, the mounting member comprising a second locking unit that is identical to the locking unit of the battery assembly, the second locking unit being configured to couple with the receiver unit of the battery assembly, wherein the second locking unit comprises a fifth electrical connector that is coupled with a main battery of the personal transportation device, wherein the second electrical connector of the receiving unit of the battery assembly electrically couples with the fifth electrical connector to transfer power from the energy storage device of the battery assembly to the main battery of the personal transportation device, wherein the fifth electrical connector and the bracket are disposed on opposing sides of the mounting member, and wherein the housing comprises a magnetic member associated with a plate, the magnetic member being adapted to magnetically couple with a mobile device.

2. The battery assembly according to claim 1, wherein the manual actuator is mechanically coupled to the locking member using a first cable and a second cable, wherein the first cable is coupled to a first side of the locking member and the second cable is coupled to a second side of the locking member.

3. The battery assembly according to claim 2, further comprising a resilient biasing member that couples the locking member to a backstop.

4. The battery assembly according to claim 3, wherein when the manual actuator is translated from a first position to a second position the first cable and the second cable draw the locking member towards the backstop to compress the resilient biasing member, placing the locking member in the retracted, unlocked position.

5. The battery assembly according to claim 1, wherein a lock notch of the receiver unit of the battery assembly receives the locking member of the mounting member in an interior portion of the battery assembly.

6. The battery assembly according to claim 1, further comprising:
a communications interface; and
a controller having a processor and memory, the processor executing instructions stored in memory to determine operational metrics of the energy storage device or another energy storage device of an additional battery assembly that is electrically coupled to the battery assembly.

7. A system, comprising:
a battery assembly comprising:
a communications interface;
an energy storage device;
a housing comprising a locking unit disposed on a first side of the housing, a receiver unit disposed on a second side of the housing opposite the first side, and a sidewall interconnecting the locking unit and the receiver unit to form an enclosure that retains the energy storage device therein, the housing further comprising:
a first electrical connector that is disposed on the first side and electrically coupled to the energy storage device, the first electrical connector facing in a first direction;
a locking member that is disposed on the first side and resiliently biased into an extended, locking position, the locking member configured to be placed into a retracted, unlocked position by operation of either a manual actuator that is mechanically coupled to the locking member or an electronically controlled actuator that is mechanically coupled to the locking member;
a second electrical connector that is disposed on the second side and electrically coupled to the energy storage device, the second electrical connector facing in a direction opposite the first direction in order that the second electrical connector can mate with a separate third electrical connector of a third device while at the same time the first electrical connector mates with a separate fourth electrical connector of a fourth device; and
a controller having a processor and memory, the processor executing instructions stored in memory to receive from and forward data to another battery assembly electrically coupled to the battery assembly or a docking station; and
the docking station being connected to a power source; and
a mounting member that comprises a bracket configured to couple with a personal transportation device, and a locking member, the mounting member comprising a second locking unit that is identical to the locking unit of the battery assembly, the second locking unit being configured to couple with the receiver unit of the battery assembly,
wherein the second locking unit comprises a fifth electrical connector that is coupled with a main battery of the personal transportation device, wherein the second electrical connector of the receiving unit of the battery assembly electrically couples with the fifth electrical connector to transfer power from the energy storage device of the battery assembly to the main battery of the personal transportation device, wherein the fifth electrical connector and the bracket are disposed on opposing sides of the mounting member, and wherein the housing comprises a magnetic member associated with a plate, the magnetic member being adapted to magnetically couple with a mobile device.

8. The system according to claim 7, wherein the actuator of the first battery assembly is mechanically coupled to the locking member using a first cable and a second cable, and wherein the first cable is coupled to a first side of the locking member and the second cable is coupled to a second side of the locking member.

9. The system according to claim 8, further comprising a resilient biasing member that couples the locking member to a backstop that is mounted to a plate.

10. The system according to claim 9, wherein when the actuator is translated from a first position to a second position the first cable and the second cable draw the locking member towards the backstop to compress the resilient biasing member, placing the locking member in the retracted, unlocked position.

11. A system, comprising:
a plurality of stackable battery assemblies arranged in a daisy-chain configuration, each of the plurality of stackable battery assemblies comprising:
   an energy storage device;
   a housing comprising a locking unit disposed on a first side of the housing, a receiver unit disposed on a second side of the housing opposite the first side, and a sidewall interconnecting the locking unit and the receiver unit to form an enclosure that retains the energy storage device therein, the housing further comprising:
      a first electrical connector that is disposed on the first side and electrically coupled to the energy storage device, the first electrical connector facing in a first direction;
      a locking member that is disposed on the first side and resiliently biased into an extended, locking position, the locking member configured to be placed into a retracted, unlocked position by operation of either a manual actuator that is mechanically coupled to the locking member or an electronically controlled actuator that is mechanically coupled to the locking member; and
      a second electrical connector that is disposed on the second side and electrically coupled to the energy storage device, the second electrical connector facing in a direction opposite the first direction in order that the second electrical connector can mate with a separate third electrical connector while at the same time the first electrical connector mates with a separate fourth electrical connector;
   a short-range wireless reader;
   a short-range wireless writer; and
   a controller comprising a processor and memory, the processor executes instructions stored in memory to receive data using the short-range wireless reader and forward the data through the short-range wireless writer to an adjacent stackable battery assembly; and
a mounting member that comprises a bracket configured to couple with a personal transportation device, and a locking member, the mounting member comprising a second locking unit that is identical to the locking units of each of the battery assemblies, the second locking unit being configured to couple with the receiver units of each of the battery assemblies,
wherein the second locking unit comprises a fifth electrical connector that is coupled with a main battery of the personal transportation device, wherein the second electrical connector of the receiving units of the battery assemblies are each configured to electrically couple with the fifth electrical connector to transfer power from the energy storage devices of the battery assemblies to the main battery of the personal transportation device, wherein the fifth electrical connector and the bracket are disposed on opposing sides of the mounting member, and wherein the housing of each of the battery assemblies comprises a magnetic member associated with a plate, the magnetic member being adapted to magnetically couple with a mobile device.

12. The system according to claim 11, wherein the energy storage device receives power from a power source when coupled to a docking station.

13. The system according to claim 12, wherein the processor is configured to determine operational metrics of the energy storage device and manage power transfer from the energy storage device to a main battery of a connected device.

14. The system according to claim 13, wherein at least one of the plurality of stackable battery assemblies receives a request from the docking station, the request being fulfilled by transmission of data through the plurality of stackable battery assemblies to the docking station.

* * * * *